United States Patent
Khemka et al.

(10) Patent No.: US 8,338,872 B2
(45) Date of Patent: Dec. 25, 2012

(54) ELECTRONIC DEVICE WITH CAPCITIVELY COUPLED FLOATING BURIED LAYER

(75) Inventors: Vishnu K. Khemka, Phoenix, AZ (US); Tahir A. Khan, Tempe, AZ (US); Ronghua Zhu, Chandler, AZ (US); Weixiao Huang, Tempe, AZ (US); Bernhard H. Grote, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 276 days.

(21) Appl. No.: 12/750,166

(22) Filed: Mar. 30, 2010

(65) Prior Publication Data

US 2011/0241092 A1 Oct. 6, 2011

(51) Int. Cl.
*H01L 29/66* (2006.01)
*H01L 21/00* (2006.01)
*H01L 21/84* (2006.01)

(52) U.S. Cl. ............... 257/299; 257/339; 257/E27.016; 257/E21.615; 438/152

(58) Field of Classification Search ................ None
See application file for complete search history.

(56) References Cited

U.S. PATENT DOCUMENTS

| | | | |
|---|---|---|---|
| 5,218,228 A | 6/1993 | Williams et al. | |
| 6,329,692 B1 | 12/2001 | Smith | |
| 6,528,380 B2 | 3/2003 | Woolery et al. | |
| 6,734,524 B1 | 5/2004 | Parthasarathy et al. | |
| 6,882,023 B2 | 4/2005 | Khemka et al. | |
| 6,930,027 B2 | 8/2005 | Parthasarathy et al. | |
| 7,087,973 B2 | 8/2006 | Mallikarjunaswamy et al. | |
| 7,187,033 B2 | 3/2007 | Pendharkar | |
| 7,282,386 B2 | 10/2007 | Khemka et al. | |
| 7,468,537 B2 | 12/2008 | Pendharkar | |
| 2004/0082133 A1 | 4/2004 | Salling et al. | |
| 2004/0084744 A1 | 5/2004 | Khemka et al. | |
| 2004/0104437 A1 | 6/2004 | Zecri et al. | |
| 2006/0261408 A1 | 11/2006 | Khemka et al. | |
| 2008/0296669 A1 | 12/2008 | Pendharkar et al. | |
| 2009/0294849 A1 | 12/2009 | Min et al. | |
| 2010/0226166 A1* | 9/2010 | Jung et al. ................. 365/149 | |

OTHER PUBLICATIONS

USPTO "Non-Final Office Action" mailed Dec. 23, 2011; U.S. Appl. No. 12/750,151, filed Mar. 30, 2010.

(Continued)

*Primary Examiner* — Fernando L Toledo
*Assistant Examiner* — Valerie N Brown
(74) *Attorney, Agent, or Firm* — Ingrassia Fisher & Lorenz, P.C.

(57) ABSTRACT

Transistors (21, 41) employing floating buried layers (BL) (72) may exhibit transient breakdown voltage $(BVdss)_{TR}$ significantly less than $(BVdss)_{DC}$. It is found that this occurs because the floating BL (72) fails to rapidly follow the applied transient, causing the local electric field within the device to temporarily exceed avalanche conditions. $(BVdss)_{TR}$ of such transistors (69. 69') can be improved to equal or exceed $(BVdss)_{DC}$ by including a charge pump capacitance (94, 94') coupling the floating BL (72) to whichever high-side terminal (28, 47) receives the transient. The charge pump capacitance (94, 94') may be external to the transistor (69, 69'), may be formed on the device surface (71) or, may be formed internally to the transistor (69-3, 69'-3) using a dielectric deep trench isolation wall (100) separating DC isolated sinker regions (86, 88) extending to the BL (72). The improvement is particularly useful for LDMOS devices.

20 Claims, 8 Drawing Sheets

OTHER PUBLICATIONS

Khemka, V., et al., Floating RESURF (FRESURF) LDMOSFET Devices with Breakthrough BVdss-Rdson (for example: 47V-0.28mW.cm2 or 93V-0.82 mW.cm2), Proc. of the Int. Symp. on Power Semicond. Dev and ICs, Japan, 2004.

Khemka, V., et al., A Floating RESURF (FRESURF) LDMOSFET Device Concept, V, IEEE Electron Dev. Letts, vol. 24, No. 10, pp. 664-666, 2003.

Khemka, V., et al., Novel Floating RESURF (FRESURF) LDMOSFETs with Improved BVdss-Rdson, IEEE electron device letters vol. 25, No. 12, Dec. 2004 pp. 804-806.

Khan, T., et al., Incremental FRESURF LDMOSFET Structure for Enhanced Voltage Blocking Capability on 1 0.13mm, SOI Based Technology, the Int. Symp. on Power Semicond. Dev and ICs, Orlando, 2008.

Parathasarthy, V., et al., SOA Improvement by a Double RESURF LDMOS Technique in a Power IC Technology IEDM (2000).

Lee, J., et al., Influence of NBL layout and LOCOS space on component ESD and system level ESD for HV-LDMOS, Lee et.al. ISPSD07, May 2007.

* cited by examiner

N CHANNEL

P CHANNEL

N CHANNEL

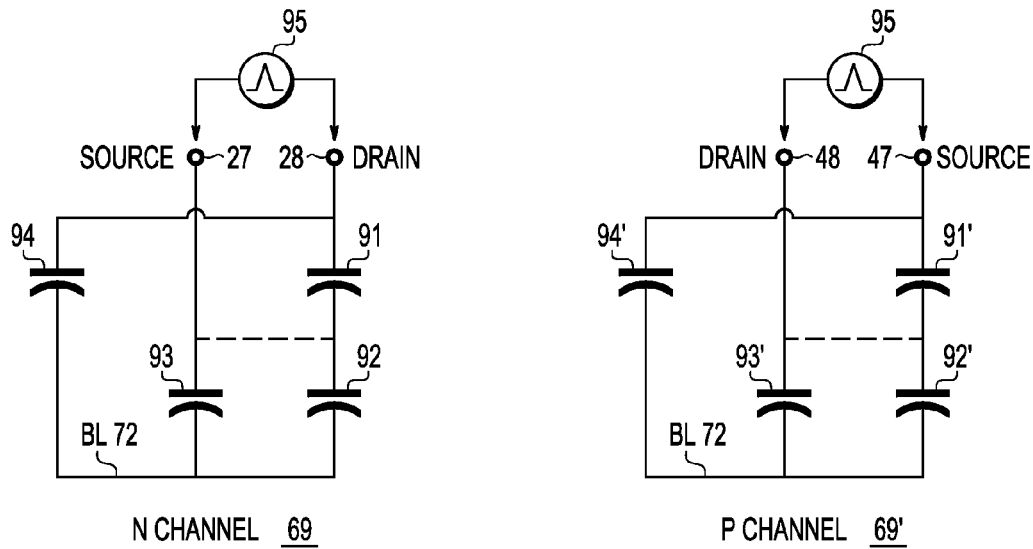
FIG. 4 68
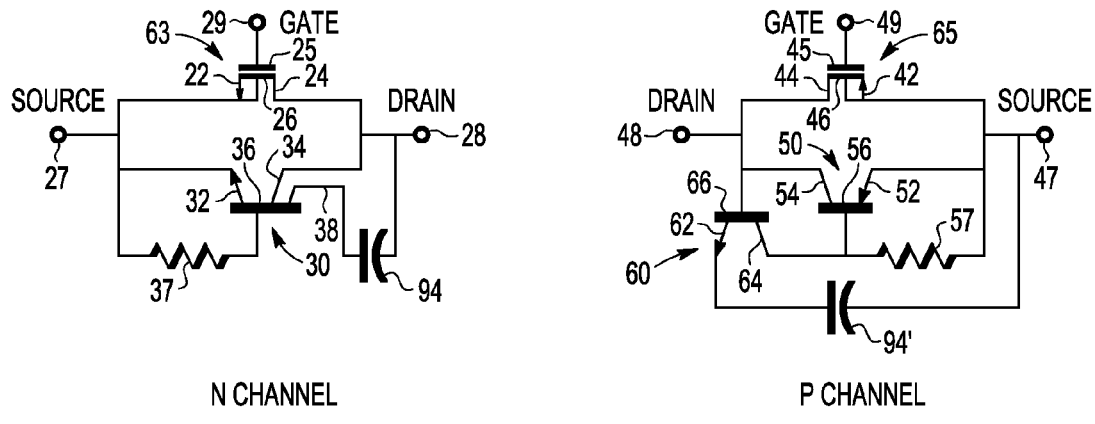
69 FIG. 5    69' FIG. 6

ELECTRONIC DEVICE WITH CAPCITIVELY COUPLED FLOATING BURIED LAYER

FIELD OF THE INVENTION

The field of the invention generally relates to semiconductor devices and methods for fabricating semiconductor devices, and more particularly relates to insulated gate field effect transistor (IGFET) devices.

BACKGROUND OF THE INVENTION

Insulated gate field effect transistor (IGFET) devices are widely used in modern electronic applications. Metal-oxide-semiconductor field effect transistor (MOSFET) devices and lateral-(double)-diffused-metal-oxide-semiconductor (LDMOS) devices are well known examples of such IGFET devices. As used herein, the term metal-oxide-semiconductor and the abbreviation MOS are to be interpreted broadly. In particular, it should be understood that they are not limited merely to structures that use "metal" and "oxide", but may employ any type of conductor, including "metal", and any type of dielectric, including "oxide". The term field effect transistor is abbreviated as "FET". It is known that improved performance of LDMOS devices can be obtained by using reduced surface field (RESURF) structures.

BRIEF DESCRIPTION OF THE DRAWINGS

The present invention will hereinafter be described in conjunction with the following drawing figures, wherein like numerals denote like elements, and wherein:

FIG. 4 is a simplified electrical schematic diagram showing the junction capacitances between the input electrodes and the underlying buried layer within the N channel devices of FIGS. 1 and 3, and the P-channel device of FIG. 2, that impact the breakdown voltage in response to very fast transients, and showing use of a charge pump capacitance to improve device behavior, according to an embodiment of the present invention;

FIG. 5 is a simplified electrical schematic diagram of the N channel LDMOSFET of FIG. 3 employing a floating buried layer, illustrating how the charge pump capacitance of FIG. 4 is provided to couple the floating buried layer to the drain, to reduce the adverse impact of rapid electrical transients appearing on the source-drain terminals, according to another embodiment of the present invention;

FIG. 6 is a simplified electrical schematic diagram of a P channel LDMOSFET employing a floating buried layer, illustrating how the charge pump capacitance of FIG. 4 is provided to couple the floating buried layer to the source, to reduce the adverse impact of rapid electrical transients appearing on the source-drain terminals, according to still another embodiment of the present invention;

DETAILED DESCRIPTION OF THE INVENTION

Figure 1:
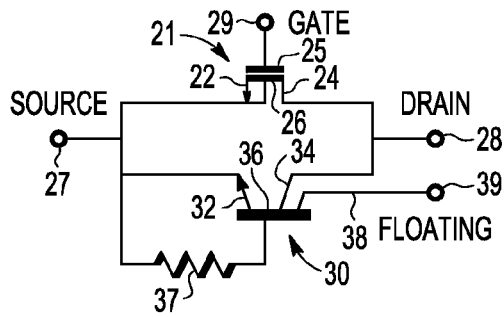
FIG. 1 is a simplified electrical schematic diagram of an N-channel LDMOS RESURF transistor including a MOSFET and parasitic bipolar transistor associated therewith, according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" (abbreviated as "SC") is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof The term "semiconductor" is abbreviated as "SC."

For convenience of explanation and not intended to be limiting, semiconductor devices and methods of fabrication are described herein for silicon semiconductors, but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type then is either P or N type.

FIG. 1 is a simplified electrical schematic diagram of N-channel LDMOS RESURF transistor 20 including MOSFET 21 and parasitic bipolar transistor 30 associated therewith, according to the prior art. LDMOS FET 21 comprises N-type source 22 and drain 24, and conductive gate 25 insulated from and overlying P-type body region 26. Source 22 is coupled to source terminal 27 and drain 24 is coupled to drain terminal 28. Parasitic bipolar transistor 30 exists between source 22 (and source terminal 27) and drain 24 (and drain terminal 28). Parasitic bipolar transistor 30 comprises N-type emitter 32 (e.g., associated with source 22), N-type collector 34 (e.g., associated with drain 24), P-type base region 36 (e.g., associated with body region 26) and internal body resistance 37. Resistance 37 and emitter 32 are coupled to source terminal 27. Collector 34 is coupled to drain terminal 28. U.S. Pat. No. 6,882,023 describes a physical RESURF LDMOS structure that can be represented by the simplified electrical schematic diagram of FIG. 1 including (e.g., N type) drift region and (e.g., P type) RESURF region under which is provided a floating buried layer (e.g., N type) identified in FIG. 1 by the label "FLOATING" 39, which has no external connection.

Figure 2:
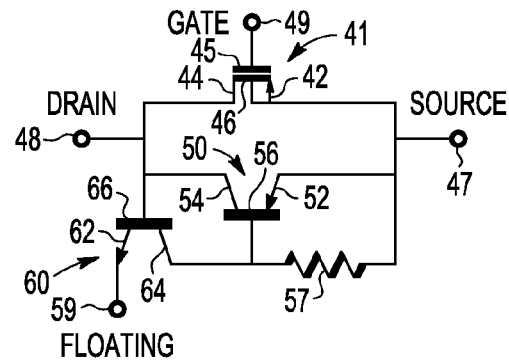
FIG. 2 is a simplified electrical schematic diagram of a P-channel LDMOS RESURF transistor including a MOSFET and parasitic bipolar transistors associated therewith.

FIG. 2 is a simplified electrical schematic diagram of P-channel LDMOS RESURF transistor 40 with MOSFET 41, parasitic bipolar transistor 50 associated therewith and further parasitic bipolar device 60. Further parasitic bipolar device 60 arises because of the presence of an (e.g., N type) floating buried layer underlying MOSFET 41 and parasitic bipolar device 50 in LDMOS transistor 40. In this respect, LDMOS transistor 40 of FIG. 2 differs from what would be obtained by simply exchanging the N and P regions of LDMOS transistor 20 of FIG. 1. MOSFET 41 comprises P-type source 42 and drain 44, and conductive gate 45 insulated from and overlying N-type body region 46. Source 42 is coupled to source terminal 47, and drain 44 is coupled to drain terminal 48. Parasitic bipolar transistor 50 exists between source 42 (and source terminal 47) and drain 44 (and drain terminal 48). Parasitic bipolar transistor 50 comprises (e.g., P-type) emitter 52 (e.g., associated with source 42), (e.g., P-type) collector 54 (e.g., associated with drain 44), (e.g., N-type) base region 56 (e.g., associated with body region 46) and internal body resistance 57. Resistance 57 and emitter 42 are coupled to source terminal 47. Collector 54 is coupled to drain terminal 48. P and N type RESURF regions and underlying (e.g., N type) floating buried layer are included in transistor 40, thereby giving rise to further parasitic bipolar transistor 60. Further parasitic bipolar transistor 60 has (e.g., P type) base 66 coupled to (e.g., P type) collector region 54 of parasitic bipolar 50 and (e.g., P type) drain 44, (e.g., N type) collector 64 coupled to (e.g., N type) base region 56 of parasitic bipolar transistor 50, and (e.g., N type) emitter 62 coupled to terminal 59, identified in FIG. 2 by the label "FLOATING" 59, which has no external connection.

The use of a floating buried layer RESURF structures represented by the electrical schematic diagrams of FIGS. 1 and 2 can provide substantially improved breakdown voltages BVdss and relatively low ON resistance Rdson. However, the relatively large area of floating buried layer regions in such devices that lie between the LDMOS device and the substrate may make them susceptible to degradation of the breakdown voltage in the presence of very fast transients, e.g., transient (TR) voltages appearing across source-drain terminals 27, 28; 47, 48 and/or regions 22, 24; 42, 44 with rise times of about 100 nanoseconds or less, especially pulses with rise times of about 10 nanoseconds or less. This can result in transient drain-source break-down voltages $(BVdss)_{TR}$ that are substantially less than DC breakdown voltages (BVdss) $_{DC}$, that is, $(BVdss)_{TR} \ll (BVdss)_{DC}$, where "TR" is understood to refer to transient signals of the type noted above and "DC" is understood to refer to zero frequency or low frequency signals. This situation is undesirable. As an aid to understanding how such $(BVdss)_{TR}$. degradation can come about, it is useful to consider the physical structure of a typical LDMOSFET device employing a floating buried layer.

Figure 3:
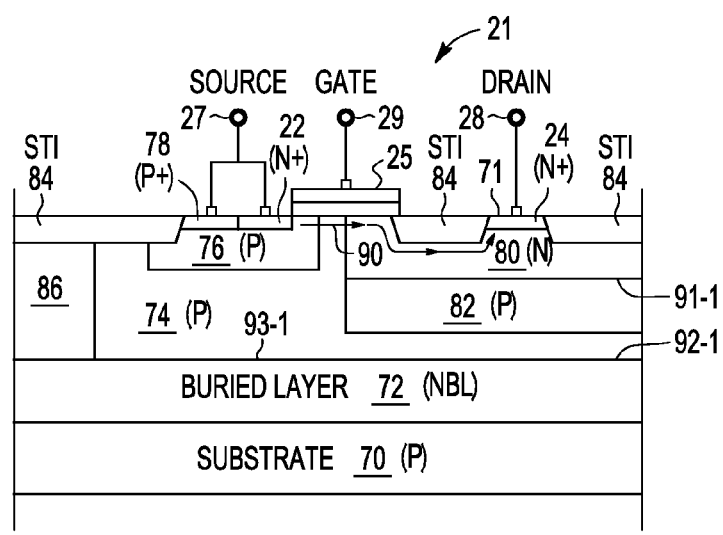
FIG. 3 is a simplified cross-section view through a transistor of the type illustrated schematically in FIG. 1 having a floating buried layer underlying the LDMOSFET, according to the prior art.

FIG. 3 is a simplified cross-section view through transistor 20 of the type illustrated schematically in FIG. 1 having floating buried layer 72 underlying MOSFET 21, according to the prior art. Where appropriate, the same reference numbers have been used in FIG. 3 as in FIG. 1 to facilitate correlation between FIGS. 1 and 3. Transistor 20 of FIG. 3 comprises semiconductor (SC) substrate 70 (e.g., P type) with overlying buried layer 72 (e.g., N type, abbreviated as "NBL"). Above buried layer 72 is overlying further (e.g., P type epi) SC region 74 extending to surface 71. Located within overlying further region 74 is body region 76 (e.g., P type). Within body region 76 are (e.g., N+) source region 22 and (e.g., P+) body contact region 78. Also located within overlying SC region 74 are (e.g., N type) drift region 80 and (e.g., P type) RESURF region 82, which generally underlies drift region 80. As is well known in the art, to obtain RESURF action, charge balancing should be provided between regions 80, and 82 and is hereafter presumed in the device of FIG. 3 and subsequent LDMOS devices. Doped (e.g., N+) drain region 24 is provided within drift region 80 extending to surface 71. N type buried layer 72 is DC isolated from overlying MOSFET 21 by PN junction 92-1 between (e.g., N type) buried layer 72 and overlying further (e.g., P type) layer or region 74. Shallow Trench Isolation (STI) regions 84 are provided extending from surface 71 into SC region 74 in the locations indicated. Sinker region 86 (e.g., N type) extends from beneath STI region 84 through further SC region 74 to make Ohmic contact to buried layer 72. Conventional gate conductor 25 is provided overlying and insulated from surface 71 between source region 22 and drift region 80 and extending somewhat there-over. When source 22, gate 25 and drain 24 are appropriately biased, channel 90 forms between source 22 and drain 24. Conductors are also conventionally provided to couple source region 22, drain region 24 and gate 25 to their respective terminals 27, 28 and 29.

FIG. 4 shows simplified electrical schematic diagram 68 of internal capacitances associated with transistor 20 of FIG. 3 and transistor 69 of FIGS. 5 ("N channel") and associated with transistor 40 of FIG. 2 and transistor 69' of FIG. 6 ("P-channel"). Schematic diagram 68 illustrates: (i) how floating buried layer (BL) 72 is capacitively coupled to source terminal 27 (and source region 22 of FIG. 1) by junction capacitance 93 and to drain terminal 28 (and to drain region 24) by junction capacitances 91, 92 in N channel device 20, 69 of FIGS. 1, 3 and 5, and (ii) how floating buried layer (BL) 72 is capacitively coupled to drain terminal 48 (and drain region 44 of FIG. 2) by junction capacitance 93' and to source terminal 47 (and source region 42) by junction capacitances 91', 92' in P channel device 40, 69' of FIGS. 2 and 6. Schematic diagram 68 also illustrates how the transient breakdown voltage $(BVdss)_{TR}$ can be improved by use of charge pump capacitance 94 between floating buried layer 72 and drain terminal 28 (or drain 24) of N channel device 69 of FIG. 5, and by use of charge pump capacitance 94' between floating buried layer 72 and source terminal 47 (or source 27) of P channel device 69' of FIG. 6.

Referring to both FIGS. 3 and 4, N Channel device capacitance 93 is associated with junction 93-1, capacitance 91 is associated with junction 91-1 and capacitance 92 is associated with junction 92-1. (Analogous P channel device capacitance 93', 91' and 92' are associated with junctions 93-1', 91-1' and 92-1' shown in FIG. 10.) Under DC (e.g., low frequency) conditions, the applied voltage is distributed across these capacitances to floating buried layer (BL) 72, and the drain-source breakdown voltage BVdss is substantially improved compared to an otherwise similar device without floating BL 72. However, it has been found that when the applied voltage is in the form of fast transient 95 (e.g., see FIG. 4) having the fast rise times noted earlier, the space-charge regions associated with the several junctions between, for example, terminals 27, 28 (or terminals 48, 47) and BL 72, represented by capacitances 93, 91, 92 (or 93', 91', 92') do not have time to adjust, with the result that the applied voltage is concentrated across a smaller region of the semiconductor (SC) thereby increasing the local electric field so that premature breakdown can occur at voltages $(BVdss)_{TR}$ much lower than $(BVdss)_{DC}$ observed with a substantially DC signal, so that $(BVdss)_{TR} \ll (BVdss)_{DC}$.

It has further been determined that this condition can be avoided by providing a circuit path by which buried layer 72 can be charge pumped, so that its voltage can also rise rapidly in response to fast transient 95, thereby preventing the localized electric field from rising above that necessary to induce avalanche and premature breakdown. This is accomplished by providing shunt capacitance 94, 94' between the appropriate source or drain terminal (or source or drain region) and buried layer 72. In the N channel device (see also FIG. 5), charge pump capacitance 94 is provided between drain terminal 28 (or drain region 24) and BL 72 and in the P channel device (see also FIG. 6), charge pump capacitance 94' is provided between source terminal 47 (or source region 42) and BL 72.

Rapid rise time pulses can be readily obtained for test purposes using transmission lines. Such transmission line pulse (TLP) tests are well known in the art. It is found that providing shunt capacitance 94, 94' improves the transient breakdown voltage so that it equals or exceeds the DC breakdown voltage. This is a much desired result and a significant improvement in the art. The desired magnitude of charge pump capacitance 94, 94' is discussed later.

FIG. 5 shows a simplified electrical schematic diagram of N-channel LDMOS RESURF transistor 69 including MOSFET 63, parasitic bipolar transistor 30 associated therewith and further capacitance 94, according to another embodiment of the present invention. The same reference numbers are used in FIG. 5 as in FIG. 1 to refer to analogous regions or elements, and reference should be had to the discussion of FIG. 1 for further details. Further capacitance 94 is coupled in FIG. 5 from lead 38 of the floating buried layer in FIG. 1 (identified as "FLOATING 39" in FIG. 1) to drain terminal 28 so that a rapidly rising pulse applied to terminal 28 can pump charge onto floating BL 72 (see also FIGS. 3-4), thereby reducing the peak electric field that must be sustained within the SC of LDMOSFET 69. Reference number 69 is also intended to refer collectively to specific embodiments 69-1, 69-2, 69-3 described later.

FIG. 6 shows a simplified electrical schematic diagram of P-channel LDMOS RESURF transistor 69' including MOSFET 65, parasitic bipolar transistor 50 associated therewith, additional parasitic device 60 as noted in connection with FIG. 2 and further capacitance 94', according to still another embodiment of the present invention. The same reference numbers are used in FIG. 6 as in FIG. 2 to refer to analogous regions and elements, and reference should be had to the discussion of FIG. 2 for further details. Further capacitance 94' is coupled in FIG. 6 from emitter 64 of further parasitic transistor 60 associated with the floating buried layer (identified as "FLOATING 59" in FIG. 2) to source terminal 47 so that a rapidly rising pulse applied to terminal 47 can pump charge onto floating BL 72 (see FIGS. 3-4), thereby reducing the peak electric field that must be sustained within the SC of LDMOSFET 69'. Reference number 69' is also intended to refer collectively to specific embodiments 69'-1, 69'-2, 69'-3 described later.

Figure 7:
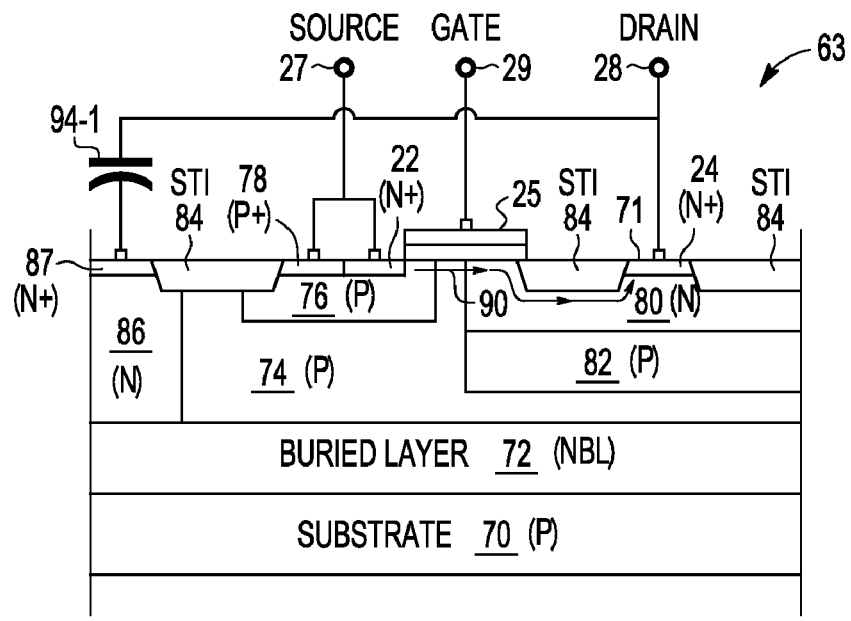
FIG. 7 is a simplified cross-section view, analogous to that of FIG. 3, through an N-channel LDMOSFET showing how the charge pump capacitance of FIG. 5 may be provided, according to a yet further embodiment of the present invention.

FIG. 7 is a simplified cross-sectional view, analogous to that of FIG. 3, through N-channel LDMOSFET 69-1 showing how charge pump capacitance 94 of FIG. 5 may be provided as external capacitance 94-1, according to a yet further embodiment of the present invention. For convenience of explanation and not intended to be limiting, in FIG. 7 and following, illustrative N and P conductivity types are included in the description and the drawings with the various reference numbers by way of example and not limitation. Persons of skill in the art will understand that such conductivity types may be interchanged in other embodiments or referred to as of a first conductivity type, which may be either N or P, and of a second opposite conductivity type which is then either P or N. The same reference numbers are used in FIG. 7 as in FIG. 3 for analogous regions and reference should be had to the discussion of FIG. 3 for further details. Device 69-1 of FIG. 7 differs from device 20 of FIG. 3 in that (e.g., N+) contact region 87 is provided to sinker region 86 and external capacitance 94-1 is coupled between drain terminal 28 (or drain region 24) and contact region 87 to sinker region 86, which is in turn coupled to buried layer (BL) 72. Thus, a charge pump path to BL 72 is provided via capacitance 94-1. The use of capacitance 94-1 means that BL 72 can continue to be floating for DC and slow AC purposes, so that the advantages of a floating RESURF BL are preserved and there is no adverse affect on the DC breakdown voltage $(BVdss)_{DC}$ or series-ON resistance, while the transient breakdown voltage $(BVdss)_{TR}$ is substantially increased.

Figure 8:
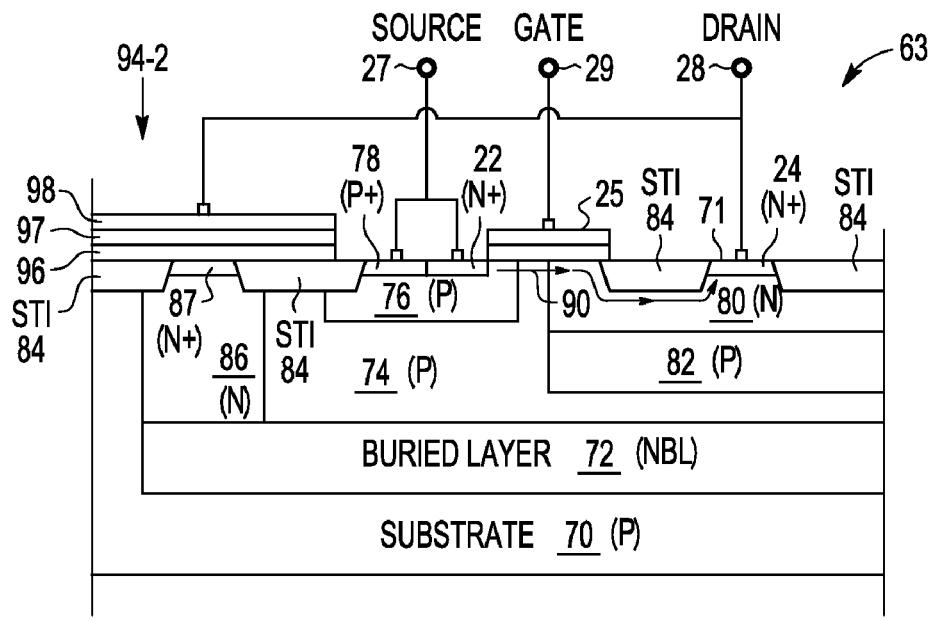
FIG. 8 is a simplified cross-section view, analogous to that of FIG. 7, through an N-channel LDMOSFET showing how the charge pump capacitance of FIG. 5 may be implemented on a monolithic substrate, according to a still yet further embodiment of the present invention.

FIG. 8 is a simplified cross-section view, analogous to that of FIG. 7, through N-channel LDMOSFET 69-2 showing how charge pump capacitance 94 of FIG. 5 may be implemented on a monolithic substrate as capacitance 94-2, according to a still yet further embodiment of the present invention. Device 69-2 of FIG. 8 differs from device 20 of FIG. 3 in that (e.g., N+) contact region 87 is provided to sinker region 86 and monolithic capacitance 94-2 formed on surface 71 of substrate 70 is coupled between drain terminal 28 (or drain region 24) and contact region 87 to sinker region 86, which is in turn coupled to buried layer (BL) 72. Capacitance 94-2 comprises: (i) lower electrically conductive electrode (e.g., metal or metal-SC alloy, etc.) 96 desirably making Ohmic connection to contact 87 to sinker region 86, (ii) interlayer dielectric 97 of relatively low loss insulator, (e.g., silicon oxide) overlying lower conductor 96, and (iii) upper electrically conductive electrode (e.g., metal or metal-SC alloy, etc.) 97 which is in turn coupled to drain terminal 28 (or drain region 24). Thus, a charge pump path is provided to BL 72 via capacitance 94-2. The use of capacitance 94-2 means that BL 72 can continue to be floating for DC and slow AC purposes, so that the advantages of a floating RESURF BL are preserved and there is no adverse affect on the DC breakdown voltage $(BVdss)_{DC}$ or series-ON resistance, while the transient breakdown voltage $(BVdss)_{TR}$ is substantially increased.

Figure 9:
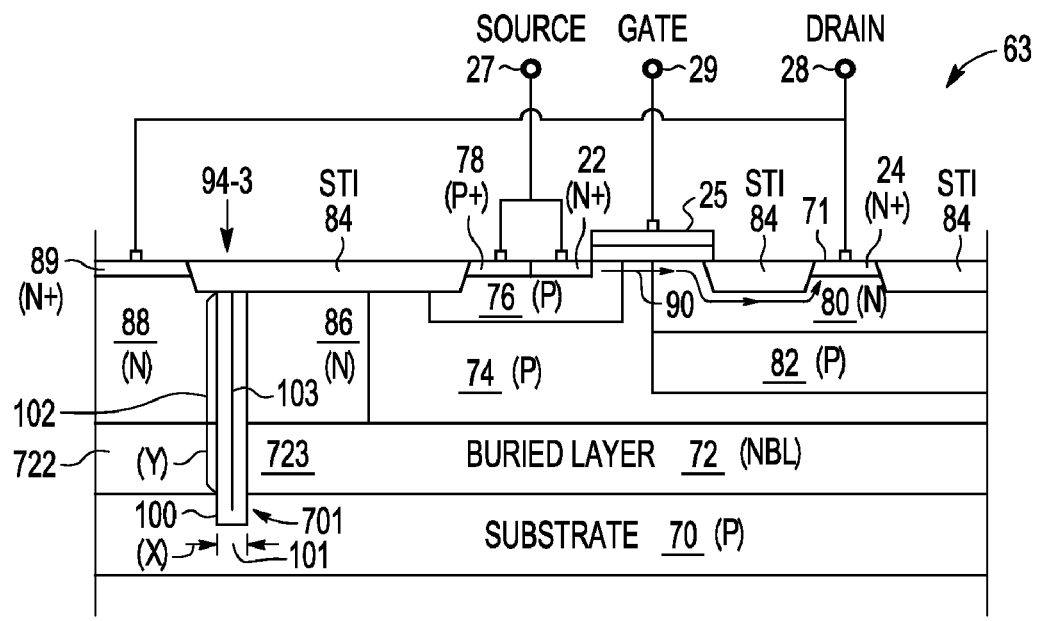
FIG. 9 is a simplified cross-section view, analogous to that of FIG. 7, through an N-channel LDMOSFET showing how the charge pump capacitance of FIG. 5 may be implemented in a monolithic substrate, according to a yet still further embodiment of the present invention.

FIG. 9 is a simplified cross-section view, analogous to that of FIG. 7, through N-channel LDMOSFET 69-3 showing how supplementary charge pump capacitance 94 of FIG. 5 may be implemented by capacitance 94-3 within monolithic substrate 70, according to a yet still further embodiment of the present invention. Device 69-3 of FIG. 9 differs from device 20 of FIG. 3 in that: (i) deep lateral dielectric isolation wall 100 is provided, in this example, adjacent sinker region 86 and extending from surface 71 (or from STI region 84) through SC region 74 and BL region 72 into underlying portion 701 of substrate 70, (ii) further sinker region 88 is provided extending from surface 71 through region 74 to further (e.g., N type) region 722 to make Ohmic contact thereto, and (iii) (e.g., N+) contact region 89 is provided to further sinker region 88. STI regions 84 may be omitted in other embodiments. Contact region 89 is electrically coupled to drain terminal 28 (or drain region 24). Further sinker region 88 and underlying region 722 may be a single doped region or separately formed, ohmically coupled doped regions of the same conductivity type. Either arrangement is useful.

Capacitance 94-3 is formed by relatively deep dielectric isolation wall 100, which DC isolates sinker region 86 and BL 72 from sinker region 88 and doped region 722. Dielectric isolation wall 100 has lateral thickness 101 and vertical extent 102 between substrate 70 and STI region 84, and functions as the dielectric layer of capacitance 94-3 between the opposed conductors formed, on the left, by sinker 88 and doped region 722 and, on the right, by sinker 86 and BL 72. Silicon dioxide is a non-limiting example of a suitable dielectric material for capacitance 94-3, but other substantially insulating materials may also be used. Means and methods for providing such dielectric isolation walls are well known in the art, and any convenient means that fulfills the desired characteristics described below may be used. In some embodiments, dielectric isolation wall 100 may comprise a sandwich of dielectric material (e.g., silicon oxide) with a polycrystalline SC (e.g., polysilicon) or other conductive inclusion 103 substantially in the center of the dielectric making up isolation wall 100. When centrally located conductive inclusion 103 is floating, its presence does no harm. Lateral thickness 101 of isolation wall 100 is desirably in the range of about 0.5 to 2.0 micrometers, more conveniently in the range of about 1.0 to 2.0 micrometers and preferably about 1.5 micrometers, although larger or smaller values can also be used. Vertical height 102 of isolation wall 100 approximately from substrate region 701 to the top of sinker 86 is desirably in the range of about 3 to 10 micrometers, more conveniently in the range of about 5 to 9 micrometers and preferably about 8 micrometers, although larger or smaller values can also be used.

The effectiveness of charge pumping into BL 72 using capacitance 94-3 depends upon the magnitude of capacitance 94-3. Persons of skill in the art will understand based on the description herein, that capacitance 94-3 may be increased by decreasing thickness (X) 101, increasing vertical height (Y) 102 and/or increasing the plan view perimeters (Z) of isolation wall 100 forming capacitance 94-3. Stated another way, capacitance $C_{94-3}=f((Y)*(Z)/(X))$, and any or all of these parameters may be adjusted to obtain the desired magnitude of capacitance. The use of capacitance 94-3 means that BL 72 can continue to be floating for DC and slow AC purposes, so that the advantages of a floating RESURF BL are preserved and there is no adverse affect on the DC breakdown voltage $(BVdss)_{DC}$ or series-ON resistance Rdson while the transient breakdown voltage $(BVdss)_{TR}$ is substantially increased. The arrangement of FIG. 9 has the further advantage that it uses chip area that would otherwise be substantially occupied by a lateral isolation wall and so has the least adverse impact on die per wafer and manufacturing cost. The arrangement of FIG. 9 is a significant and valuable advance in the art and is preferred.

Figure 10:
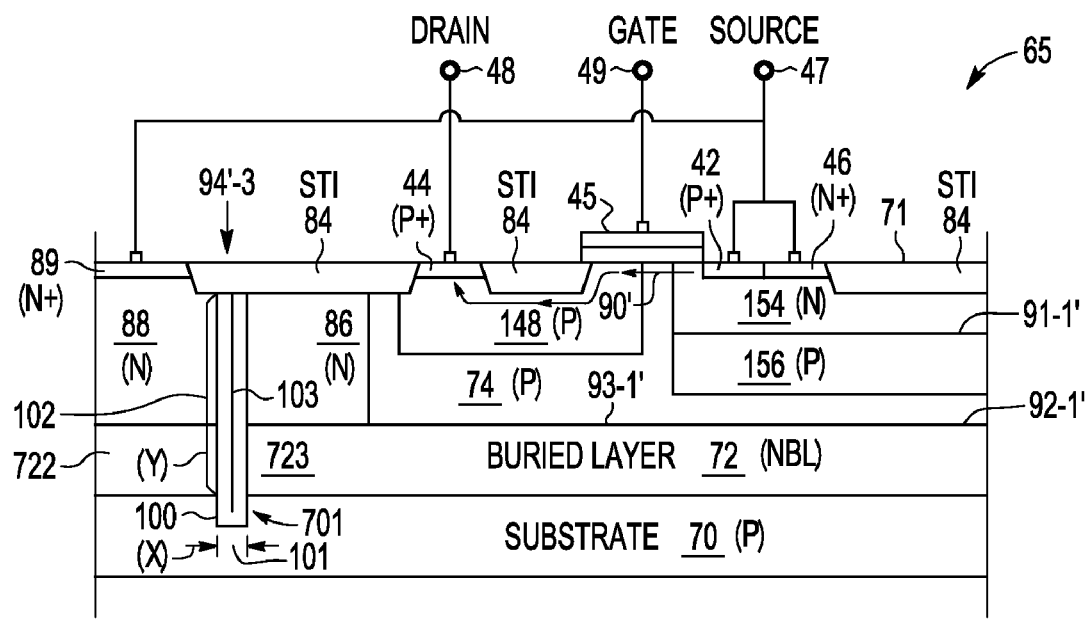
FIG. 10 is a simplified cross-section view, analogous to that of FIG. 9, through a P-channel LDMOSFET showing how the charge pump capacitance of FIG. 6 may be implemented in a monolithic substrate, according to a still yet another embodiment of the present invention.

FIG. 10 is a simplified cross-section view, corresponding to that of FIG. 6 and analogous to that of FIG. 9, through P-channel LDMOSFET 69'-3 showing how supplementary capacitance 94' of FIG. 6 may be implemented by capacitance 94'-3 within monolithic substrate 70, according to a still yet further embodiment of the present invention. Device 69'-3 of FIG. 10 comprises semiconductor (SC) substrate 70 (e.g., P type) with overlying buried layer 72 (e.g., N type, abbreviated as "NBL" or "BL 72"). Above buried layer 72 is further overlying (e.g., P type epi) SC region 74 extending to surface 71. Located within overlying region 74 is (e.g., N type) body region 154. Within body region 154 are (e.g., P+) source region 42 and (e.g., N+) body contact region 46. Also located within overlying SC region 74 is (e.g., P type) RESURF region 156, which generally underlies body region 154. Also located in further SC region 74 is (e.g., P type) drift region 148. Doped (e.g., P+) drain region 44 is provided within drift region 148 extending to surface 71. Shallow Trench Isolation (STI) regions 84 are desirably provided extending from surface 71 into SC region 74 in the locations indicated. STI regions 84 may be omitted in other embodiments.

Sinker region 86 (e.g., N type) extends from beneath STI region 84 through further SC region 74 to make Ohmic contact to buried layer 72. Conventional gate conductor 45 is provided overlying and insulated from surface 71 between source region 42 and drift region 148 and extending somewhat there-over. Conductors are conventionally provided to couple source region 42, drain region 44 and gate 45 to their respective terminals 47, 48 and 49. When source 42, gate 45 and drain 44 are appropriately biased, channel 90' forms between source 42 and drain 44. Device 69'-3 has: (i) relatively deep lateral dielectric isolation wall 100, in this example, adjacent sinker region 86 and extending from surface 71 (or from STI region 84) through SC region 74 and BL region 72 into underlying portion 701 of substrate 70, (ii) further sinker region 88 is provided extending from surface 71 through region 74 to further (e.g., N type) region 722 to make Ohmic contact thereto, and (iii) (e.g., N+) contact region 89 is provided to further sinker region 88. Contact region 89 is electrically coupled to source terminal 47 (or source region 42). Further sinker region 88 and underlying region 722 may be a single doped region or may be separately formed, ohmically coupled doped regions of the same conductivity type. Either arrangement is useful.

Capacitance 94'-3 is formed by dielectric isolation wall 100, which DC isolates sinker region 86 and BL 72 from sinker region 88 and doped region 722. The discussion of dielectric isolation wall 100 in connection with FIG. 9 should be referred to for further details. The use of capacitance 94'-3 means that BL 72 can continue to be floating for DC and slow AC purposes, so that the advantages of a floating RESURF BL are preserved and there is no adverse affect on the DC breakdown voltage $(BVdss)_{DC}$ or series-ON resistance Rdson while the transient breakdown voltage $(BVdss)_{TR}$ is substantially increased. The arrangement of FIG. 10 has the further advantage in that it uses chip area that would otherwise be substantially occupied by a lateral isolation wall and so has the least adverse impact on die per wafer and manufacturing cost. The arrangement of FIG. 10 is a significant and valuable advance in the art and is preferred.

Persons of skill in the art will understand based on the description herein, that charge pump capacitance 94'-3 of P channel device 69'-3 of FIG. 10 employing dielectric trench isolation wall 100 between sinkers 88 and 86 may be replaced by charge pump capacitances 94'-1 corresponding to capacitance 94-1 of N channel device 69-1 of FIG. 7 or by charge pump capacitances 94'-2 corresponding to capacitance 94-2 of N channel device 69-2 of FIG. 8. Any of these P channel device arrangements is useful and a significant advance in the art.

Further, with respect to the embodiments of FIGS. 7-10, capacitances 94-1, 94-2, 94-3 for N channel devices, and equivalent capacitances 94'-1, 94'-2, 94'-3 for P channel devices, should be large enough so that, usefully at least 5% of the voltage of fast transient 95 is coupled from terminals 27, 28 (or 47, 48) to buried layer 72, more conveniently at least about 10% of fast transient voltage 95 is coupled from terminals 27, 28 (or 47, 48) to buried layer 72, and preferably at least about 20% of fast transient voltage 95 is coupled from terminals 27, 28 (or 47, 48) to buried layer 72, but other values may also be used. In the examples of N channel and P channel devices described above, both use N type buried layers, and the charge pump capacitance 94, 94' is coupled to the high side terminal receiving the fast transient, for example, drain 24 (or drain terminal 28) of N channel device 69, or source 42 (or source terminal 47) of P channel device 69'.

FIGS. 11-19 are simplified cross-sectional views through device 69-3 of FIG. 9 at different stages 211-219 of manufacture showing structures 311-319, according to additional embodiments of the present invention. Persons of skill in the art will understand that the manufacturing sequence illustrated hereafter can generally also be used to form those devices illustrated in cross-sections in FIGS. 7-10. Modifications needed to provide regions of somewhat different lateral extent, thickness and/or doping, if needed, are within the capabilities of those of skill in the art.

Figure 11:
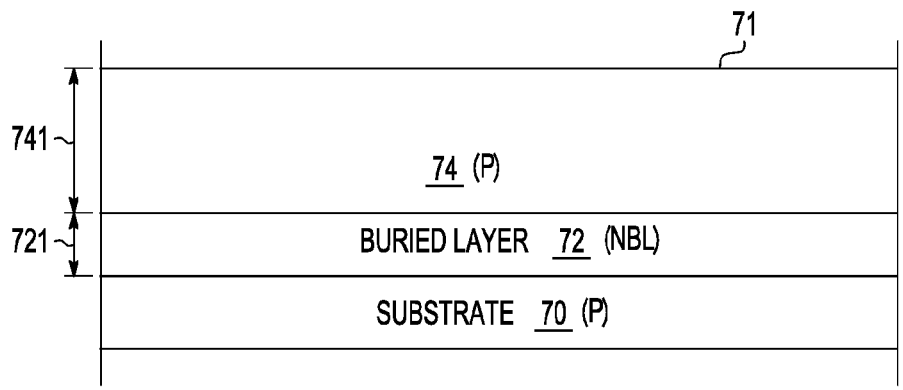
FIGS. 11-19 are simplified cross-sectional views through the device of FIG. 9 at different stages of manufacture according to additional embodiments of the present invention.

Referring now to manufacturing stage 211 of FIG. 11, semiconductor (SC) containing substrate 70 is provided. Buried layer 72 of thickness 721 is formed in or on substrate 70, for example by ion implantation, but other doping means well known in the art may also be used. In preferred embodiments, at least the upper portion of substrate 70 is P type with doping density usefully in the range of about 1E15 to 1E18 $cm^{-3}$, more conveniently in the range of about 1E15 to 1E16 $cm^{-3}$ and preferably about 2E15 $cm^{-3}$, although higher and lower values can also be used as well as other doping types. Boron is a suitable dopant for substrate 70, but other dopants may also be used. Buried layer 72 is desirably N type with doping density usefully in the range of about 5E18 to 1E20 $cm^{-3}$, more conveniently in the range of about 1E19-to 5E19 $cm^{-3}$ and preferably about 2E19 $cm^{-3}$, although higher and lower values can also be used and other doping types. Thickness 202 is usefully in the range of about 0.5 to 3.0 micrometers, more conveniently in the range of about 1.0 to 2.0 micrometers and preferably about 1.5 micrometers, but larger and smaller values may also be used. Further SC region or layer 74 of thickness 741 with upper surface 71 is formed above buried layer 72. Epitaxial growth is a useful means for providing further SC region of layer 74, but other well known techniques may also be used to form structure 311 resulting from manufacturing stage 211. Layer or region 74 is desirably P type with doping density usefully in the range of about 5E14 to 5E16 $cm^{-3}$, more conveniently in the range of about 1E15 to 1E16 $cm^{-3}$ and preferably about 2E15 $cm^{-3}$, although higher and lower values can also be used and other doping types. Thickness 741 is usefully in the range of about 1.0 to 10.0 micrometers, more conveniently in the range of about 2.0 to 5.0 micrometers and preferably about 4.0 micrometers, but larger and smaller values may also be used. Structure 311 results. The combination of substrate 70, buried layer 72 and further SC region or layer 74 is also referred to as semiconductor body 70, 72, 74 or semiconductor containing body 70, 72, 74 having an upper surface 71.

Figure 12:
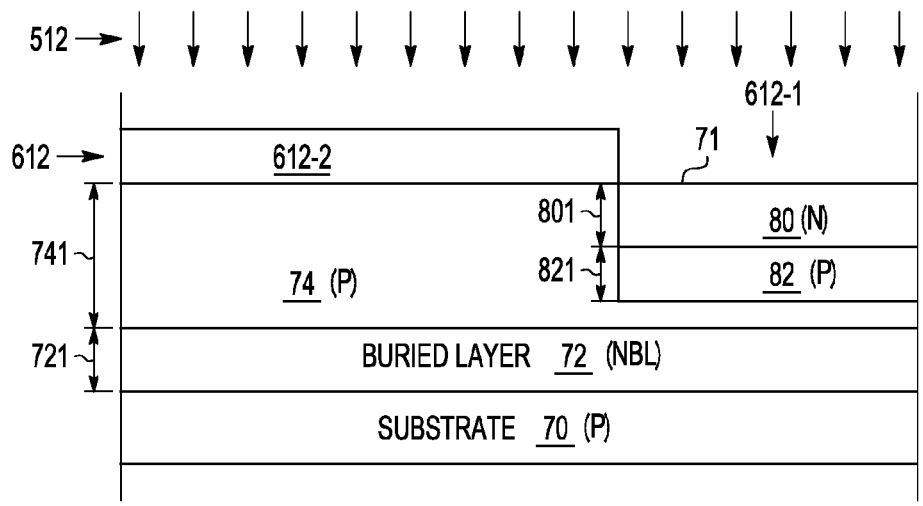

Referring now to manufacturing stage 212 of FIG. 12, mask 612 is applied above surface 71 with closed portion 612-2 and opening 612-1. Ion implant 512 is desirably used to form superposed doped region 80 of thickness or depth 801 and doped region 82 of thickness or depth 821 through opening 612-1. A chain implant is preferred although separate implants may also be used in other embodiments. Region 80 is conveniently N type and region 82 is conveniently P type, but other doping types may be used in other embodiments. Phosphorus is a suitable dopant for forming region 80 and boron is a suitable dopant for forming regions 82, with the implant energies being selected to provide depths 801, 821 respectively. Region 80 has a peak doping density usefully in the range of about 1E16 to 1E17 $cm^{-3}$, more conveniently in the range of about 2E16 to 5E16 $cm^{-3}$ and preferably about 4E16 $cm^{-3}$, although higher and lower values can also be used and other doping types. Depth 801 is usefully in the range of about 0.5 to 2.5 micrometers, more conveniently in the range of about 1.0 to 2.0 micrometers and preferably about 1.0 micrometers, but larger and smaller values may also be used. Region 82 has a peak doping density usefully in the range of about 1E16 to 1E17 $cm^{-3}$, more conveniently in the range of about 2E16-to 5E16 $cm^{-3}$ and preferably about 4E16 $cm^{-3}$, although higher and lower values can also be used and other doping types. Depth 821 usefully in the range of about 0.5 to 2.5 micrometers, more conveniently in the range of about 1.0 to 2.0 micrometers and preferably about 1.0 micrometers, but larger and smaller values may also be used. Structure 312 results. Analogous process steps may be used to form doped regions 154 (e.g., N type) and 156 (e.g., P type) of FIG. 10.

Figure 13:
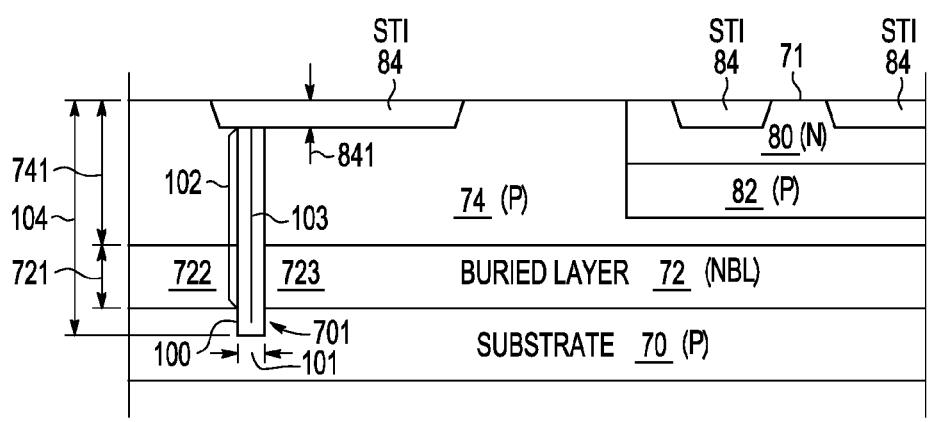

Referring now to manufacturing stage 213 of FIG. 13, mask 612 is removed and shallow trench isolation (STI) regions 84 of thickness or depth 841 from surface 71 are desirably formed at the indicated location using teachings well known in the art. STI regions 84 may be omitted in whole or in part in other embodiments. Silicon dioxide is a non-limiting example of a suitable dielectric for STI regions 84 but other well known insulators may also be used. Thicknesses or depth 841 is usefully in the range of about 0.1 to 0.6 micrometers, more conveniently in the range of about 0.2 to 0.5 micrometers and preferably about 0.35 micrometers, but larger and smaller values may also be used. Before, during or after the formation of STI regions 84, relatively deep dielectric trench isolation (DTI) wall 100 of depth 104 from surface 71 and width 101, with or without poly inclusions 103, is formed, also using teachings well known in the art. While DTI wall 100 is shown as extending from beneath STI region 84, in other embodiments, DTI wall 100 may extend from surface 71. Either arrangement is useful. DTI wall 100 extends into portion 701 of substrate 70 beneath BL 72, so to DC isolate (e.g., N type) portion 722 of BL 72 of FIG. 13 to the left of DTI wall 100 from portion 723 of BL 72 of FIG. 13 to the right of DTI wall 100. In a preferred embodiment, in plan view (not shown), DTI wall 100 laterally encloses the active regions of LDMOS device 69-3, but other plan view layouts may also be used in other embodiments. Structure 313 results.

Figure 14:
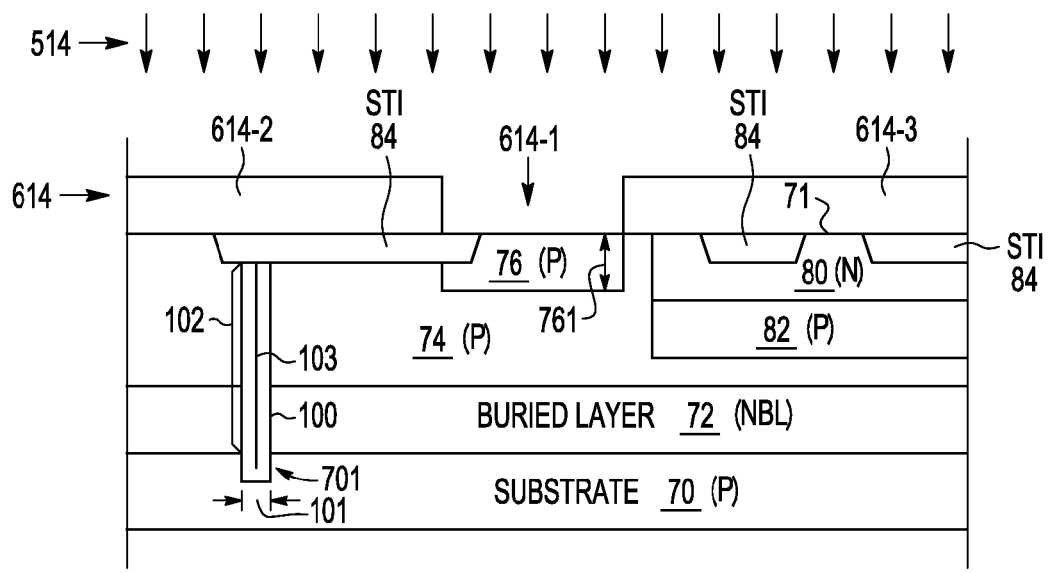

Referring now to manufacturing stage 214 of FIG. 14, mask 614 is applied having opening 614-1 and closed portions 614-2, 614-3. Ion implant 514 is desirably provided to form (e.g., P type) body region 76 of depth or thickness 761. Region 76 has a peak doping density usefully in the range of about $1E17$ to $5E18$ cm$^{-3}$, more conveniently in the range of about $5E17$ to $2E18$ cm$^{-3}$ and preferably about $1E18$ cm$^{-3}$, although higher and lower values can also be used as well as other doping types. Depth 761 usefully in the range of about 0.5 to 2.0 micrometers, more conveniently in the range of about 1.0 to 1.5 micrometers and preferably about 1.0 micrometers, but larger and smaller values may also be used. Structure 314 results. Region 148 (e.g., P type) of FIG. 10 can be formed in an analogous manner, having similar depth or thickness and doping usefully in the range of about $1E16$ cm$^{-3}$ to $1E17$ cm$^{-3}$, more conveniently in the range of about $2E16$ cm$^{-3}$ to $8E16$ cm$^{-3}$ and preferably about $5E16$ cm$^{-3}$, but other values may also be used.

Figure 15:
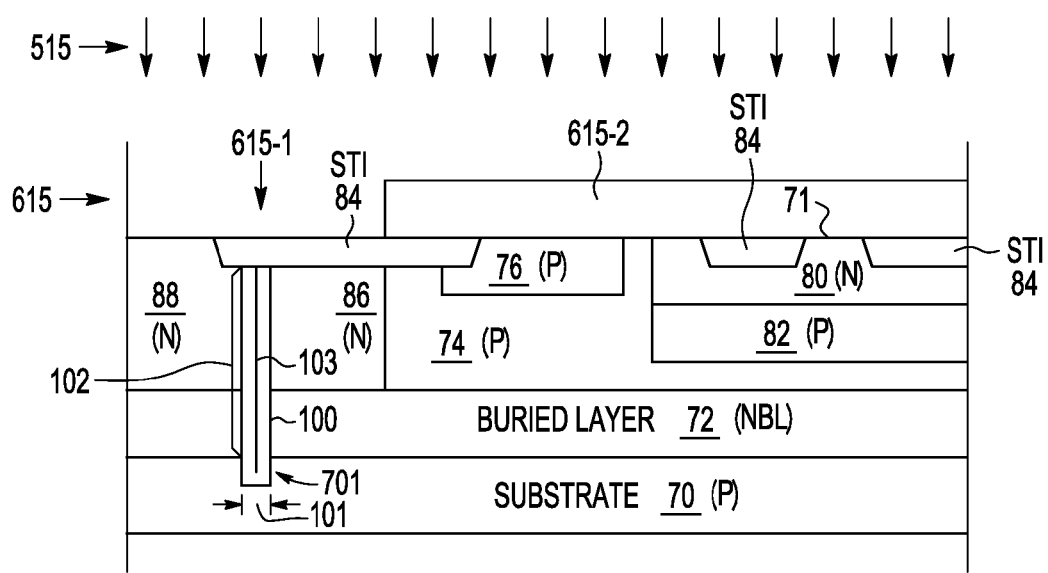
Figure 16:
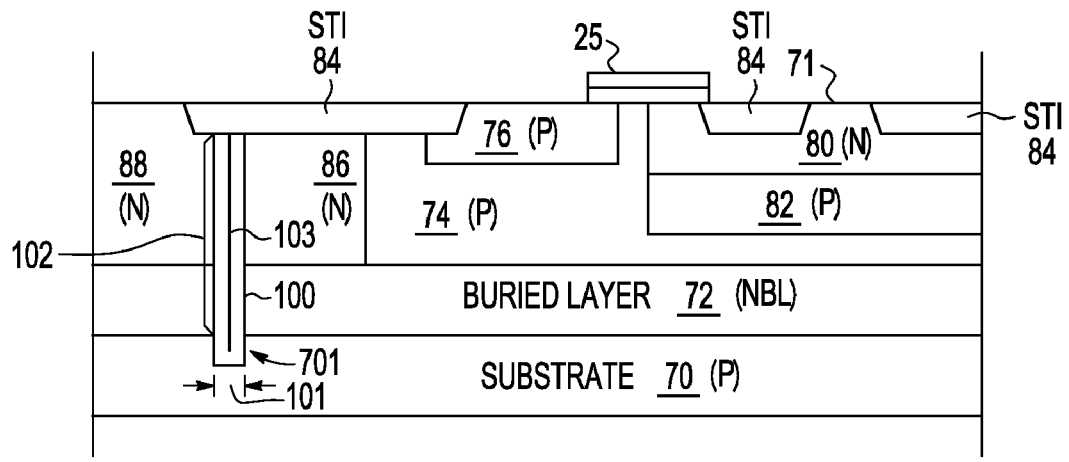
Figure 17:
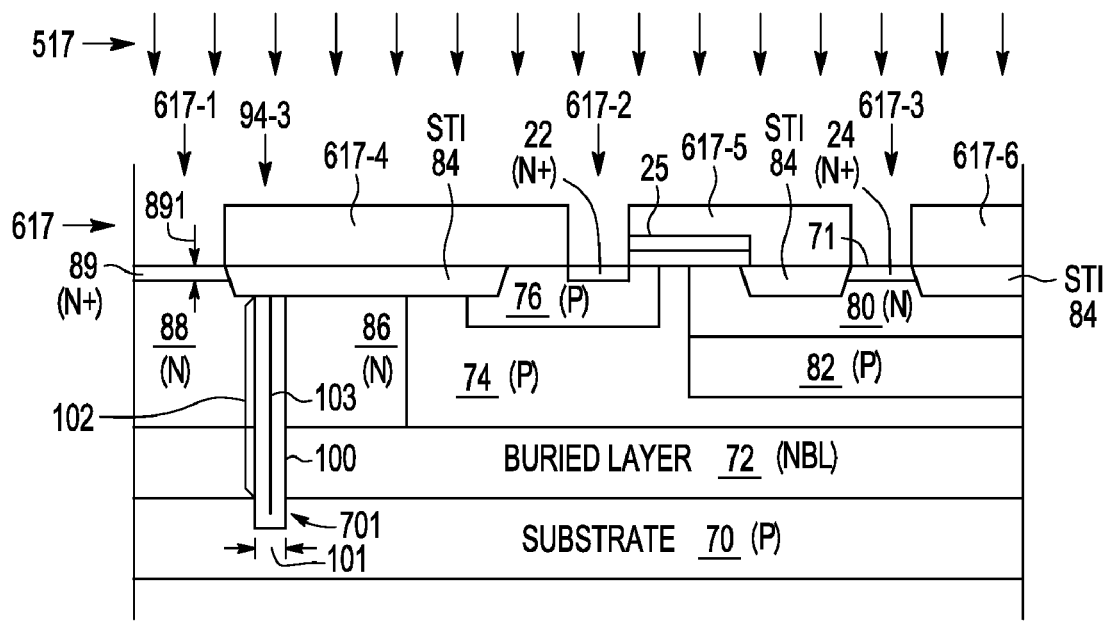
Figure 18:
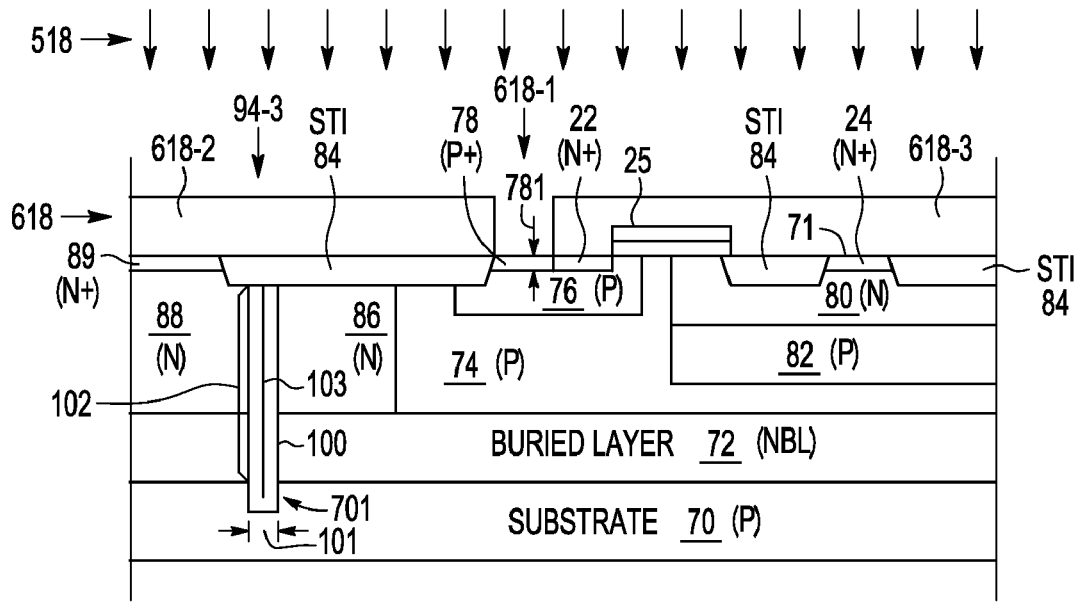
Figure 19:
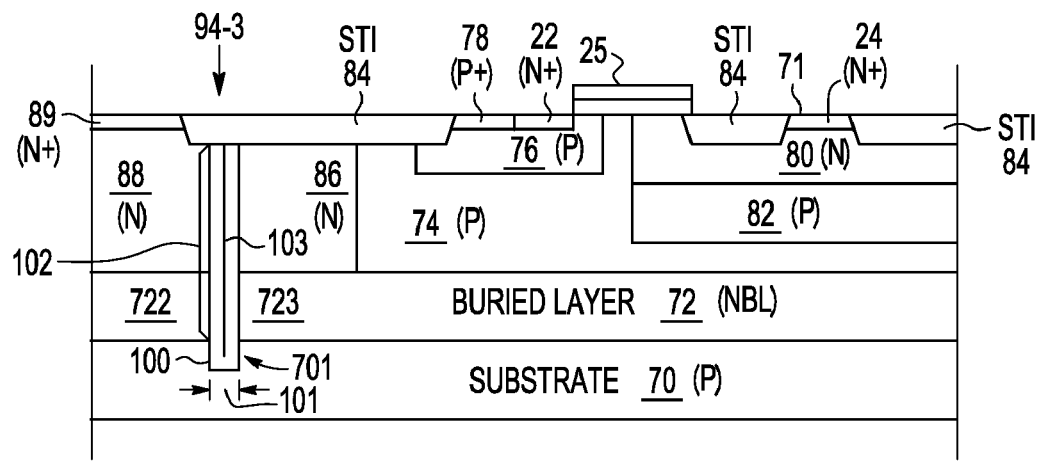

Referring now to manufacturing stage 215 of FIG. 15, mask 614 is removed and mask 615 is applied having opening 615-1 and closed portion 615-2. Ion implant 515 is desirably used to form (e.g., N type) sinker regions 86, 88 of depth sufficient to provide Ohmic (non-rectifying) contact to buried layer 72. Other doping means well known in the art may also be used in other embodiments. Phosphorus is a non-limiting example of a suitable dopant. Sinker regions 86, 88 have a doping density usefully in the range of about $1E18$ to $5E19$ cm$^{-3}$, more conveniently in the range of about $2E18$ to $1E19$ cm$^{-3}$ and preferably about $5E18$ cm$^{-3}$, although higher and lower values can also be used as well as other doping types. Structure 315 results. Referring now to manufacturing stage 216 of FIG. 16, mask 614 is removed and gate 25 provided overlying a suitable gate insulator on surface 71 in the indicated location, using means well known in the art. Gate 25 of FIGS. 16-18 is analogous to gate 45 of FIG. 10. Structure 316 results.

Referring now to manufacturing stage 217 of FIG. 17, mask 617 is provided on surface 71, having openings 617-1, 617-2, 617-3 and closed portions 617-4, 617-5, 617-6. Implant 517 is provided through openings 617-1, 617-2, 617-3 so as to form (e.g., N+) source region 22 in body region 76, drain region 24 in drift region 80 and contact region 89 in sinker region 88. Phosphorus is a non-limiting example of a suitable dopant for regions 22, 24, 89 with a doping density usefully in the range of about $1E19$ to $1E21$ cm$^{-3}$, more conveniently in the range of about $5E19$ to $5E20$ cm$^{-3}$ and preferably about $1E20$ cm$^{-3}$, although higher and lower values can also be used and other doping types. Regions 22, 24, 89 may be relatively shallow, with depth 891 usefully in the range of about 0.1 to 0.5 micrometers, more conveniently in the range of about 0.2 to 0.4 micrometers and preferably about 0.2 micrometers, but larger and smaller values may also be used. Structure 317 results. Region 46 of FIG. 10 may be formed in substantially the same way.

Referring now to manufacturing stage 218 of FIG. 18, mask 617 is removed and mask 618 provided on surface 71, having opening 618-1 and closed portions 618-2, 618-3. Implant 518 is provided through opening 618-1 to form (e.g., P+) body contact region 78 in body region 76. Boron is a non-limiting example of a suitable dopant for region 78 with a doping density usefully in the range of about $1E19$ to $1E21$ cm$^{-3}$, more conveniently in the range of about $5E19$ to $5E20$ cm$^{-3}$ and preferably about $1E20$ cm$^{-3}$, although higher and lower values can also be used as well as other doping types. Depth 781 is usefully in the range of about 0.1 to 0.5 micrometers, more conveniently in the range of about 0.2 to 0.4 micrometers and preferably about 0.2 micrometers, but larger and smaller values may also be used. Structure 318 results. Regions 42, 44 (e.g., P+) of FIG. 10 may be formed in substantially the same way.

Referring now to manufacturing stage 219, mask 618 is removed. Structure 319 results. Conductive contacts are then made to regions 22, 24, 89, and 78 using teachings well known in the art. The interconnections to couple such regions to source, drain and gate terminals and to couple contact 89 of sinker region 88 to drain region 24 or drain terminal 28 are also formed using teachings well known in the art, thereby providing substantially finished device 69-3 of FIG. 9. Substantially finished device 69'-3 of FIG. 10 is similarly provided by making connections to and between the analogous regions of device 69'-3 of FIG. 10.

According to a first embodiment, there is provided an electronic device (69, 69'), comprising, an MOS transistor (63, 65) having current carrying terminals including a source (22, 42) and a drain (24, 44) in a semiconductor containing body (70, 72, 74) having an upper surface (71), a DC isolated buried layer (72) underlying the MOS transistor (63, 65), and a charge pump capacitance (94, 94') coupled between one of the current carrying terminals (22, 42; 24, 44) and the DC isolated buried layer (72). According to a further embodiment, the MOS transistor (63) is an N channel transistor and the DC isolated buried layer (72) is N type. According to a still further embodiment, the MOS transistor (65) is a P channel transistor and the DC isolated buried layer (72) is N type. According to a yet further embodiment, the charge pump capacitance (94-1, 94'-1) is external to the MOS transistor (63, 65). According to a still yet further embodiment, the charge pump capacitance (94-2, 94'-2) is formed over the upper surface (71). According to a yet still further embodiment, the charge pump capacitance (94-2, 94'-2) is a deposited capacitance. According to another embodiment, the charge pump capacitance (94-3, 94'-3) is formed under the upper surface (71). According to a still another embodiment, the charge pump capacitance (94-3, 94'-3) comprises a dielectric trench isolation wall (100) penetrating substantially from the upper surface (71) through the DC isolated buried layer (72) underlying the MOS transistor (63, 65). According to a yet another embodiment, the dielectric trench isolation wall (100) has a first sinker region (86) on a first side thereof facing toward the MOS transistor (63, 65) and a second sinker region (88) on a second side thereof facing away from the MOS transistor (63, 65), wherein the first sinker region (86) is Ohmically coupled to the DC isolated buried layer (72) and the second sinker region (88) is Ohmically coupled to one of the source (42) and drain (24) of the MOS transistor (63, 65) and the first (86) and second (88) sinker regions are DC isolated from each other by the dielectric trench isolation wall (100). According to a till yet another embodiment, the MOS transistor (63, 65) is an LDMOS transistor (69, 69').

According to a second embodiment, there is provided an LDMOS transistor (69, 69'), comprising, a buried SC layer region (72), a further SC region (74) overlying the buried layer region (72) and having an upper surface (71), a MOSFET (63, 65) formed in the further SC region (74), wherein the MOSFET (63, 65) comprises, a body region (76, 154) having therein a source region (22, 42) of the MOSFET (63, 65), and a carrier drift region (80, 148) laterally separated from the body region (76, 154) and having therein a drain region (24, 44) of the MOSFET (63, 65), and a charge pump capacitance (94, 94') coupled between the buried layer region (72) and one of the drain region (24) and the source region (42) of the MOSFET (63, 65). According to a further embodiment, the charge pump capacitance (94-1, 94'-1; 94-2, 94'-2) is formed substantially over the upper surface (71). According to a still further embodiment, the charge pump capacitance (94-1, 94'-1; 94-2, 94'-2) is formed substantially on the upper surface (71). According to a yet further embodiment, the charge pump capacitance (94-3, 94'-3) is formed substantially beneath the upper surface (71). According to a still yet further embodiment, the charge pump capacitance (94, 94') has a capacitance value adapted to pump charge into the buried layer (72) in response to a fast voltage transient voltage (95) applied between the source (22, 42) and drain (24, 44) so as to temporarily raise a voltage of the buried layer (72) by at least 5% of the magnitude of fast voltage transient voltage (95). According to a yet still further embodiment, the charge pump capacitance (94, 94') has a capacitance value adapted to pump charge into the buried layer (72) in response to a fast voltage transient (95) applied between the source (22, 42) and drain (24, 44) so as to temporarily raise the voltage of the buried layer (72) by at least 10% of the magnitude of fast voltage transient voltage (95).

According to a third embodiment, there is provided a method for providing an LDMOS transistor (69, 69'), comprising, forming a buried layer (72) of a first conductivity type, forming a further SC region (74) of a second, opposite, conductivity type on the buried layer (72), and having an upper surface (71), forming a first doped region (80, 154) of the first conductivity type in a first portion of the further SC region (74) extending at least in part to the upper surface (71) and overlying at least part of the buried layer (72), forming a dielectric trench isolation wall (100) extending though the further SC region (74) and the buried layer (72), and laterally separated from the first doped region (80, 154), forming another doped region (76, 148) of the second conductivity type extending into the further semiconductor region (74) between the first doped region (80, 154) and the dielectric trench isolation wall (100) and laterally separated from the first doped region (80, 154) by a portion of the further semiconductor region (74), forming first (86) and second (88) sinker regions of the first conductivity type extending substantially from the surface (71) through the further semiconductor region (74) to make Ohmic contact to the buried layer (72), the first sinker region (86) located on a first side of the dielectric trench isolation wall (100) toward the first doped region (80, 154) and the second sinker region (88) located on a second side of the dielectric trench isolation wall (100) facing away from the first doped region (80, 154) so that, (i) the first (86) and second (88) sinker regions and (ii) portions (722, 723) of the buried layer (72) lying on either side of the dielectric trench isolation wall (100) are DC isolated from each other, providing a second sinker Ohmic contact region (89) of the first conductivity type in the second sinker region (88), wherein if the LDMOS transistor (69, 69') is an N channel LDMOS transistor (69), providing a drain region (24) of the first conductivity type in the first doped region (80) and Ohmically connecting the second sinker contact region (89) to the drain region (24), and wherein if the LDMOS transistor (69, 69') is a P channel LDMOS transistor (69'), providing a source region (42) of the second conductivity type in the first doped region (154) and Ohmically connecting the second sinker contact region (89) to the source region (42). According to a further embodiment, the method further comprises, forming a gate insulator with an overlying gate conductor (25, 45) on the upper surface (71) above at least the portion of the further semiconductor region (74) between the first doped region (80, 154) and the another doped region (76, 148). According to a still further embodiment, the LDMOS transistor (69, 69') is an N channel LDMOS transistor (69) and the source region (22), the drain region (24) and the second sinker Ohmic contact region (89) are formed substantially at the same time. According to a yet further embodiment, the LDMOS transistor (69, 69') is a P channel LDMOS transistor (69'), and the second sinker Ohmic contact region (89) and a body contact region (46) to the first doped region (154) are formed at substantially the same time.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electronic device, comprising:
    an MOS transistor having current carrying terminals including a source and a drain in a semiconductor containing body having an upper surface;
    a DC isolated buried layer underlying the MOS transistor;
    a sinker region in ohmic contact with the DC isolated buried layer; and
    a charge pump capacitance coupled between one of the current carrying terminals and the sinker region.

2. The electronic device of claim 1, wherein the MOS transistor is an N channel transistor and the DC isolated buried layer is N type.

3. The electronic device of claim 1, wherein the MOS transistor is a P channel transistor and the DC isolated buried layer is N type.

4. The electronic device of claim 1, wherein the charge pump capacitance is external to the MOS transistor.

5. The electronic device of claim 1, wherein the charge pump capacitance is formed over the upper surface.

6. The electronic device of claim 5, wherein the charge pump capacitance is a deposited capacitance.

7. The electronic device of claim 1, further comprising a monolithic capacitance formed over the sinker region and providing at least portion of the charge pump capacitance.

8. The electronic device of claim 7, wherein the monolithic capacitance comprises:
    an electrically conductive layer coupled to one of the source and drain; and
    an interlayer dielectric disposed between the electrically conductive layer and the sinker region.

9. An electronic device, comprising:
    a MOS transistor having current carrying terminals including a source and a drain in a semiconductor containing body having an upper surface;
    a DC isolated buried layer underlying the MOS transistor; and
    a charge pump capacitance coupled between one of the current carrying terminals and the DC isolated buried layer, the charge pump capacitance formed under the upper surface and comprising a dielectric trench isolation wall penetrating substantially from the upper surface through the DC isolated buried layer underlying the MOS transistor.

10. The electronic device of claim 9, wherein the dielectric trench isolation wall has a first sinker region on a first side thereof facing toward the MOS transistor and a second sinker region on a second side thereof facing away from the MOS transistor, wherein the first sinker region is Ohmically coupled to the DC isolated buried layer and the second sinker region is Ohmically coupled to one of the source and drain of the MOS transistor and the first and second sinker regions are DC isolated from each other by the dielectric trench isolation wall.

11. The electronic device of claim 10, wherein the MOS transistor is an LDMOS transistor.

12. The electronic device of claim 9, further comprising a first sinker region in ohmic contact with the DC isolated buried layer and adjacent the dielectric trench isolation wall.

13. The electronic device of claim 12, further comprising a second sinker region formed in ohmic contact with the buried layer and separated from the first sinker region by the dielectric trench isolation wall.

14. The electronic device of claim 12, further comprising:
a sinker region contact in ohmic contact with the first sinker region and electrically coupled to one of the source and drain;
a source or drain (S/D) contact electrically coupled to one of the source and drain; and
an isolation feature formed between the sinker region contact and the S/D contact.

15. The electronic device of claim 14, wherein the sinker region contact is electrically coupled to one of the source and drain, and wherein the S/D contact is electrically coupled to the other of the source and drain.

16. An LDMOS transistor, comprising:
a buried layer;
a further SC region overlying the buried layer and having an upper surface;
a MOSFET formed in the further SC region, wherein the MOSFET comprises:
a body region having therein a source region of the MOSFET, and
a carrier drift region laterally separated from the body region and having therein a drain region of the MOSFET; and
a charge pump capacitance coupled between the buried layer region and one of the drain region and the source region of the MOSFET, the charge pump capacitance having a capacitance value adapted to pump charge into the buried layer in response to a fast voltage transient voltage applied between the source and drain so as to temporarily raise a voltage of the buried layer by at least 5% of the magnitude of fast voltage transient voltage.

17. The LDMOS transistor of claim 16, wherein the charge pump capacitance is formed substantially over the upper surface.

18. The LDMOS transistor of claim 16, wherein the charge pump capacitance is formed substantially on the upper surface.

19. The LDMOS transistor of claim 16, wherein the charge pump capacitance is formed substantially beneath the upper surface.

20. The LDMOS transistor of claim 16, wherein the charge pump capacitance has a capacitance value adapted to pump charge into the buried layer in response to a fast voltage transient applied between the source and drain so as to temporarily raise the voltage of the buried layer by at least 10% of the magnitude of fast voltage transient voltage.

* * * * *